(12) United States Patent
Kaneko

(10) Patent No.: US 7,405,590 B1
(45) Date of Patent: Jul. 29, 2008

(54) SYSTEMS AND METHODS FOR CONTROLLING A FUSE PROGRAMMING CURRENT IN AN IC

(75) Inventor: Masaaki Kaneko, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/779,411

(22) Filed: Jul. 18, 2007

(51) Int. Cl.
*G06F 7/38* (2006.01)
*H03K 19/173* (2006.01)

(52) U.S. Cl. .............................. 326/38; 326/37; 326/30
(58) Field of Classification Search ............. 326/30–34, 326/37–38
See application file for complete search history.

(56) References Cited

U.S. PATENT DOCUMENTS 6,972,614 B2   12/2005  Anderson, II et al.
7,254,078 B1 *  8/2007  Park et al. ................ 365/225.7
2007/0081406 A1 * 4/2007  Boerstler et al. ......... 365/225.7

\* cited by examiner

*Primary Examiner*—Anh Q Tran
(74) *Attorney, Agent, or Firm*—Law Offices of Mark L. Berrier

(57) ABSTRACT

Systems and methods for controlling the programming current directed through a fuse or set of fuses in a device such as an integrated circuit. One embodiment comprises a method for applying different currents to a set of calibration fuses, identifying which currents cut the corresponding fuses without destroying them, and selecting one of the identified currents to use in programming one or more target fuses. In one embodiment, fuses that are cut but not destroyed are identified by passing the same read current through each of the calibration fuses and comparing resulting voltages to reference voltages which correspond to impedances between the impedances of the possible fuse states (uncut, cut and destroyed.) Fuse voltages between the reference voltages identify fuses which are cut but not destroyed.

20 Claims, 12 Drawing Sheets

SYSTEMS AND METHODS FOR CONTROLLING A FUSE PROGRAMMING CURRENT IN AN IC

BACKGROUND

1. Field of the Invention

The invention relates generally to fuses in integrated circuits (IC's) and more particularly to systems and methods to control the current used to program a component or set of components used to persistently store data in an IC.

2. Related Art

It is sometimes necessary to maintain some device specific information for a device such as integrated circuit (IC). It is convenient if not necessary to store this information in the IC itself. In order to do this, some part of the circuitry must act as a persistent storage. One solution is to incorporate into the circuitry a set of components and encode the desired information by programming it into the components. There are various trade-offs in the choice of components for this task, such as size, ease of programming, persistence, etc.

One conventional method is to incorporate fuses, such as laser fuses, into a device. These fuses are programmed by evaporating the fuses' metal links. In other words, the fuses are "cut". The programmed information is then read by determining which of the fuses have been cut and which have not. Cut fuses may, for example, be interpreted as 0's, while uncut fuses may be interpreted as 1's. The programming is permanent.

The opportunities to program laser fuses are limited to a small window of time in the manufacturing process when the fuses are exposed. An additional limitation is the minimum size of such fuses related to the wavelength of the laser. The wavelength of the laser is typically large relative to the feature size of contemporary IC's, making it difficult to cut the fuses without damaging nearby circuitry.

An alternative to laser fuses is electrically programmable fuses such as Ti-Silicide or other metal-silicide fuses. These (and fuses of similar construction) may also be referred to as poly fuses or eFuses. An eFuse is programmed by passing a large current through the fuse to "cut" it. The mechanism underlying the programming of an (metal-silicide) eFuse is based on the agglomeration of the material of a silicide layer in the fuse. The agglomeration occurs when the current density (and temperature) are sufficient to bring about an appropriate degree of electromigration.

eFuses are smaller and more readily programmed than laser fuses. An eFuse can be programmed at a more convenient stage in the manufacturing process, or at some time well after manufacturing. Also, the potential for collateral damage is decreased (with proper programming).

As noted above, eFuses are programmed using an agglomeration based on electromigration. Electromigration is the mass transport caused by the (gradual) migration of the ions in a conductor due to the momentum exchange between moving (conducting) electrons and nearby diffusing metal atoms (ions). Over a period of time a sufficient number of atoms are forced far from their original positions, and gaps (voids) are created, restricting or preventing conduction. Agglomeration refers to the piling up of the migrating atoms.

Normally, electromigration does not occur in semiconductors, but instead occurs in an IC's metal interconnects. Designers have taken advantage of this effect by constructing fuse components out of appropriately affected materials such as Ti-Silicide, which can then be subjected to high currents/voltages to program the fuses. However, when the current is too large or is applied for too long, the fuse can be damaged or even destroyed. Other problems may arise. For example, in some cases, a short circuit can occur in nearby components.

An eFuse, both in its unprogrammed, unaltered (i.e., uncut) state and properly programmed (i.e., cut) state, carries a current and has an impedance in a specified range. If the fuse is programmed with current that is too high, and the fuse is damaged or even destroyed, it may have an impedance that is well outside the desired range(s). There is also the potential for collateral damage to nearby components in the device.

Therefore, the selection and application of the appropriate programming current is important. A conventional programming circuit can apply only a single current in the programming of a fuse. Unfortunately, this current can vary. Environmental factors, variations in the manufacture of the integrated circuits, and other factors can contribute to variations in the current that is used to program the fuses. It would therefore be desirable to provide systems and methods to automatically determine and apply the appropriate programming current.

SUMMARY OF THE INVENTION

One or more of the problems outlined above may be solved by the various embodiments of the invention. Broadly speaking, the invention includes systems and methods for controlling the programming current used to cut fuses such as metal-silicide fuses in a device such as an integrated circuit. Different currents are applied to a set of calibration fuses. The currents range from a level which is insufficient to cut the fuses to a level which is sufficient to destroy the fuses. After the different currents are applied to corresponding fuses, the fuses that were cut but not destroyed (and the corresponding currents) are identified. One of these currents is then selected for programming additional (target) fuses.

One embodiment comprises a method. First, multiple, different currents are passed through a set of calibration fuses. Then, currents that cut corresponding ones of the calibration fuses without destroying them are identified. One of these identified currents is automatically selected and used to program one or more target fuses. In one embodiment, the currents have incrementally increasing values from a lowest current to a highest current. This may be accomplished by placing each calibration fuse in series with a corresponding calibration transistor between a supply voltage and ground, where each successive transistor is configured to allow an incrementally greater amount of current to pass through the corresponding fuse when the transistor is switched on. The cut (but not destroyed) fuses can be identified by their impedances which are below the impedance of a destroyed fuse and above the impedance of an uncut fuse. The impedance of each calibration fuse may be determined by comparing a voltage drop across the fuse (or an associated voltage) with reference voltages that corresponding to impedances between those of uncut, cut and destroyed fuses. Once the currents that cut but did not destroy the calibration fuses are identified, one of these currents (in the middle of the range represented by the identified currents) may be automatically selected and control signals generated to cause this selected current to be applied to target fuses when they are programmed.

An alternative embodiment comprises a system for automatically selecting a fuse programming current and applying it to target fuses. The system includes calibration circuitry for selecting the programming current and programming circuitry for applying the selected current to target fuses. The calibration circuitry is configured to pass multiple, different currents through a set of calibration fuses, identify the currents that cut corresponding ones of the calibration fuses without destroying them, and automatically select one of the identified currents. The programming circuitry is configured to program one or more target fuses with the selected current. The system may implement various features as described above with respect to the method embodiment.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
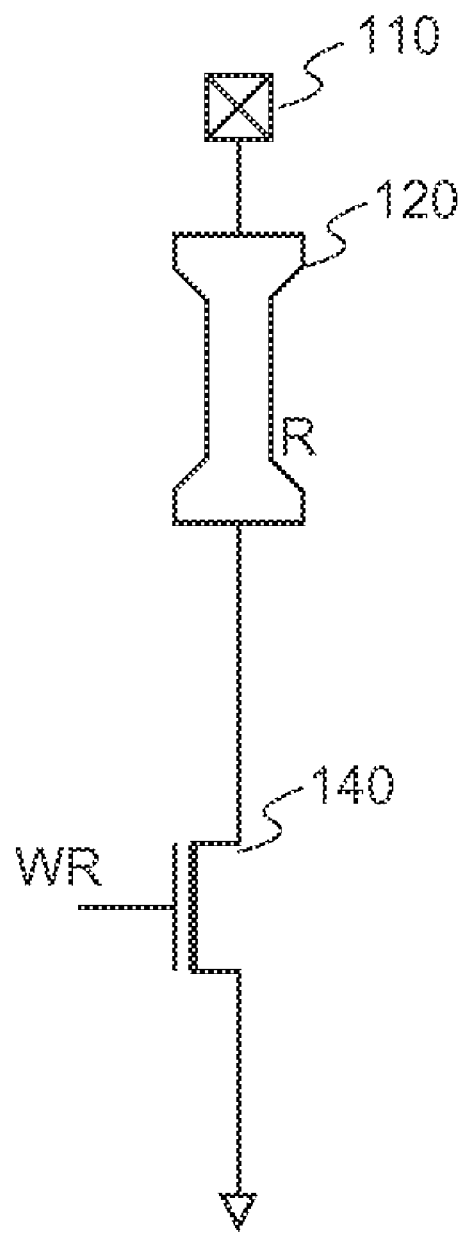
FIG. 1 is a functional block diagram illustrating a programming-circuit in accordance with the prior art.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for identifying and selecting a current for programming fuses in a device such as an integrated circuit.

Before describing the invention in detail, it is helpful to understand how a fuse is programmed. This generally entails directing a large current through a fuse in such a way as to drive up the impedance. Typically, this increase is achieved through damage to the fuse itself. In a simple fuse, a conductive (metal) link is melted or evaporated by an excessive current, making the fuse completely non-conductive (i.e., opening the circuit). As noted above, in an eFuse, a programming current is designed to cause an agglomeration of a layer of conductive material in the fuse, thereby increasing its impedance (though not creating an open circuit).

When an eFuse is programmed, its impedance is changed. The eFuse is programmed (i.e., written) by passing a high current through it. This programming current must be high enough to agglomerate the silicide layer, but not so high as to cause unintentional damage to the fuse or, possibly, neighboring components. The fuse's state can be determined (i.e., read) by passing a relatively low current through the fuse and reading the voltage drop across it to determine its impedance.

FIG. 1 illustrates a conventional configuration for programming an eFuse. eFuse 120 is coupled in series with transistor 140 between supply voltage 110 and ground. The input to transistor is WR which is asserted when programming eFuse 120. Circuitry for reading the eFuse (e.g., using a higher-conductance transistor or a variable-voltage source) may also be provided, but is not shown here.

Source 110 provides the necessary high voltage for programming the eFuse. To program eFuse 120, signal WR is asserted (high) so that NMOS transistor 140 is switched on. Current flows through eFuse 120 to ground through transistor 140. As noted above, this current is high enough to cause the eFuse 120 to be cut (or possibly destroyed). Signal WR is subsequently deasserted so that NMOS transistor 140 is switched off and other operations involving the programmed fuse, such as identifying the state of the fuse can be performed.

The term "uncut" is used herein to describe an unaltered, unprogrammed fuse and is characterized by a low impedance (e.g., R). The term "cut" is used to describe a properly programmed fuse characterized by an elevated, bounded impedance (e.g., 10R). The term "destroyed" is used to describe an improperly programmed fuse characterized by a large increase in impedance, typically well above that of a cut fuse (e.g., 1000R). Programming that causes a fuse to be "destroyed" may not sever the circuit and it may, or may not, damage surrounding components.

Figure 2:
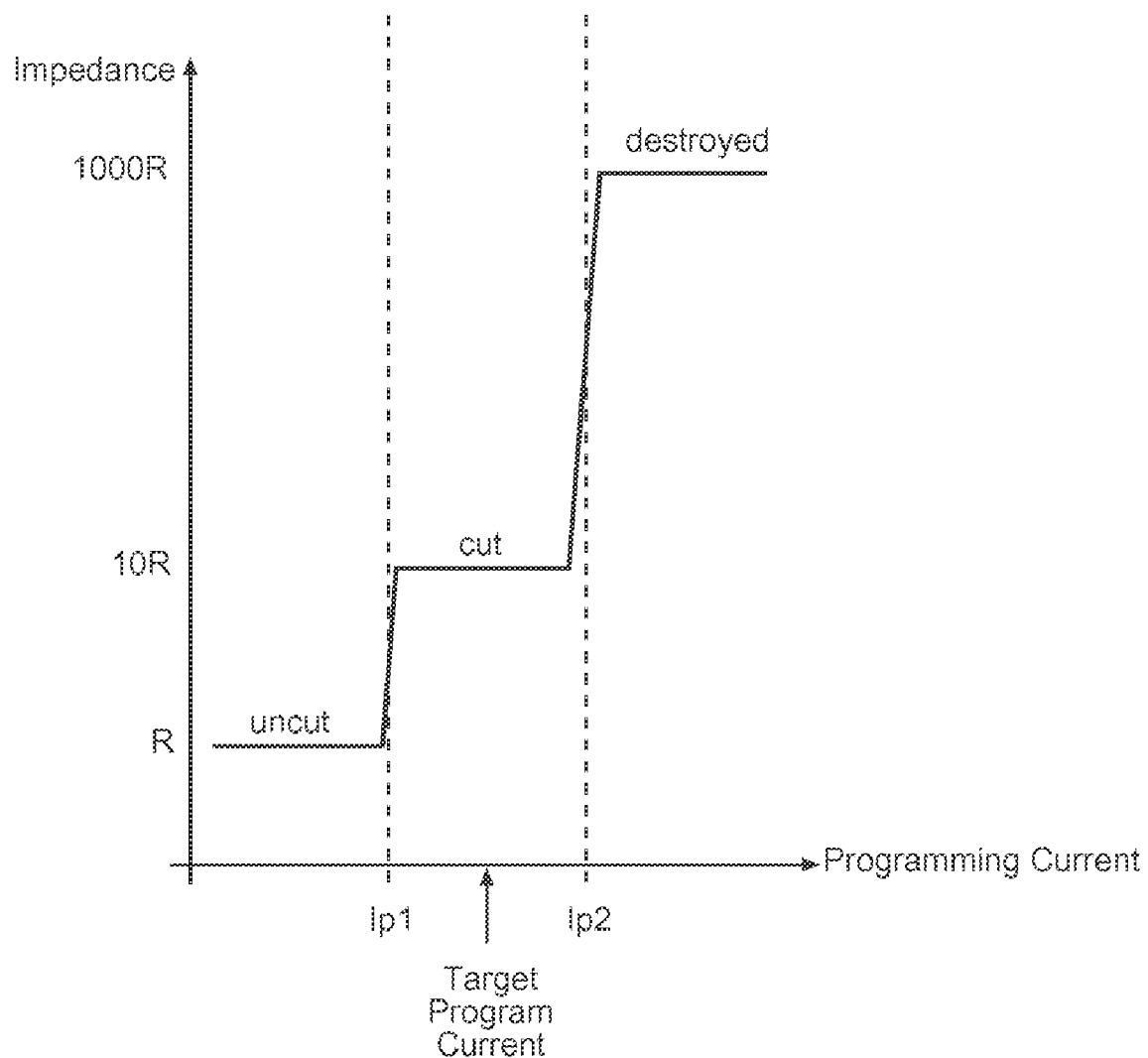
FIG. 2 is a plot illustrating an example of fuse impedance as a function of programming current.

FIG. 2 illustrates an exemplary relationship between programming current and programmed impedance of a metal-silicide eFuse. There are three regions: uncut, cut, and destroyed. In its unprogrammed, uncut state, the eFuse has a base impedance of R. When an appropriate programming current is applied to the fuse (between Ip1 and Ip2) during a fuse write (programming) operation, the silicide layer of the fuse will be agglomerated, increasing the impedance of the fuse to a desired range around 10R. The fuse is then considered cut. If the programming current is too low (less than Ip1), the eFuse is not cut, and the resulting impedance will remain at about R. If the programming current is too high (greater than Ip2), the eFuse is destroyed and the impedance of the fuse is much greater than 10R (in this example, approximately 1000R). Only when the programming current is within an appropriate range (between Ip1 and Ip2) does the fuse write operation result in the desired agglomeration and impedance (i.e., 10R). Several factors can affect the needed programming current, and the details necessary to accommodate them may not be known a priori. It is therefore desirable to have systems and/or methods to ensure that the programming current is appropriate.

Figure 3:
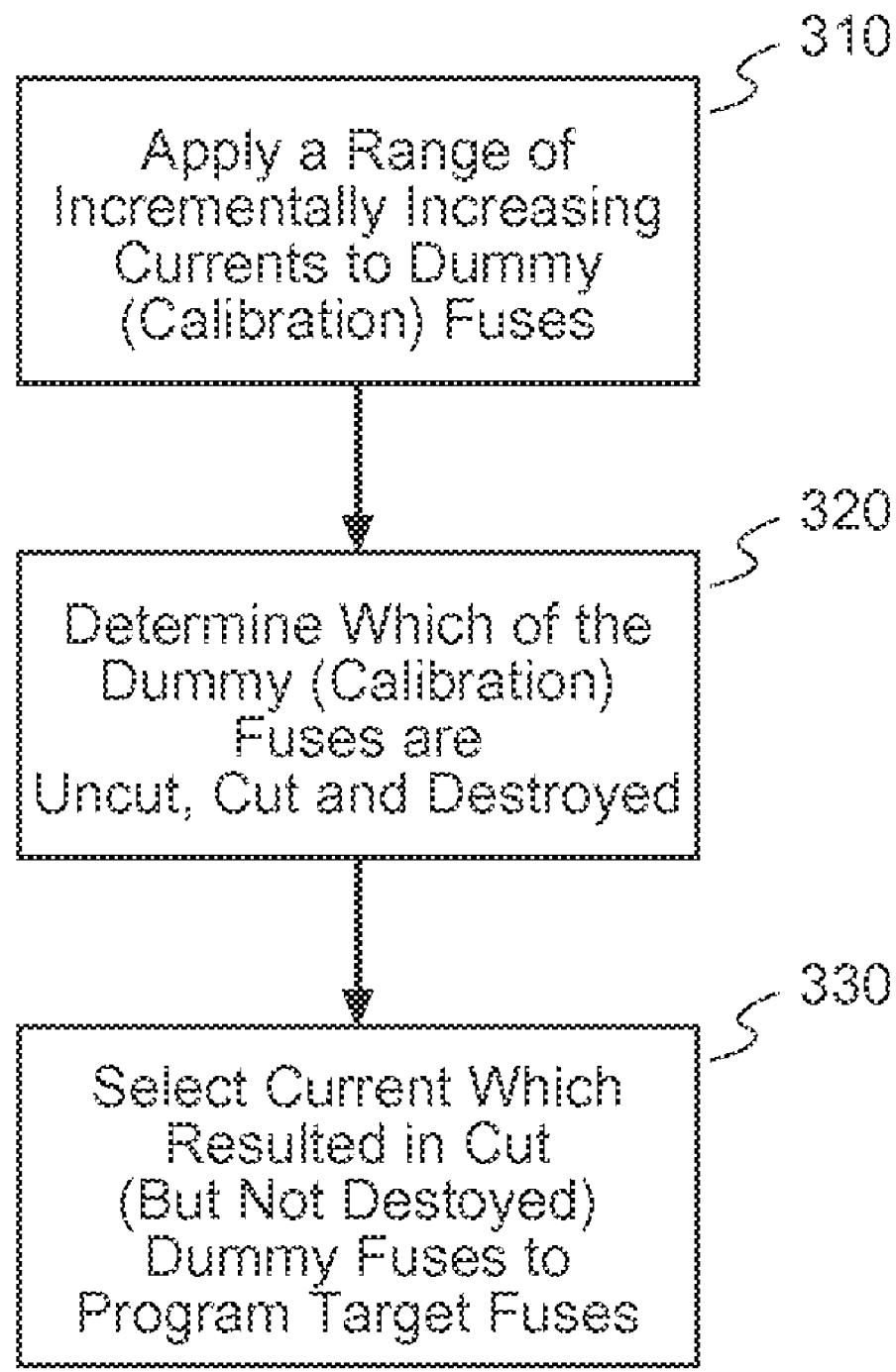
FIG. 3 is a flowchart of a method to determine a programming current in accordance with one embodiment.

Referring to FIG. 3, a flowchart illustrating a method for automatically selecting a fuse-programming current in accordance with one embodiment is shown. In this very simplified method, a range of currents that may be used to program fuses are applied to a set of dummy fuses, or calibration fuses (block 310.) In this embodiment, the currents increase incrementally to cover a range that extends from a low current which can safely be assumed to be insufficient for programming a fuse to a high current which can safely be assumed to be sufficient to destroy a fuse. After these currents have been applied to the calibration fuses, it is determined which of the calibration fuses are uncut, which of the fuses are cut, and which of the fuses are destroyed (block 320.) From this, it can be determined which of the currents were insufficient to cut the fuses and which of the currents were large enough to destroy the fuses. One of the remaining currents (which were sufficient to cut the fuses, but not large enough to destroy the fuses) can then be used to program additional fuses (block 330.) Preferably, the selected current will be one which is in the middle of the range of those currents which properly cut the calibration fuses.

Figure 4:
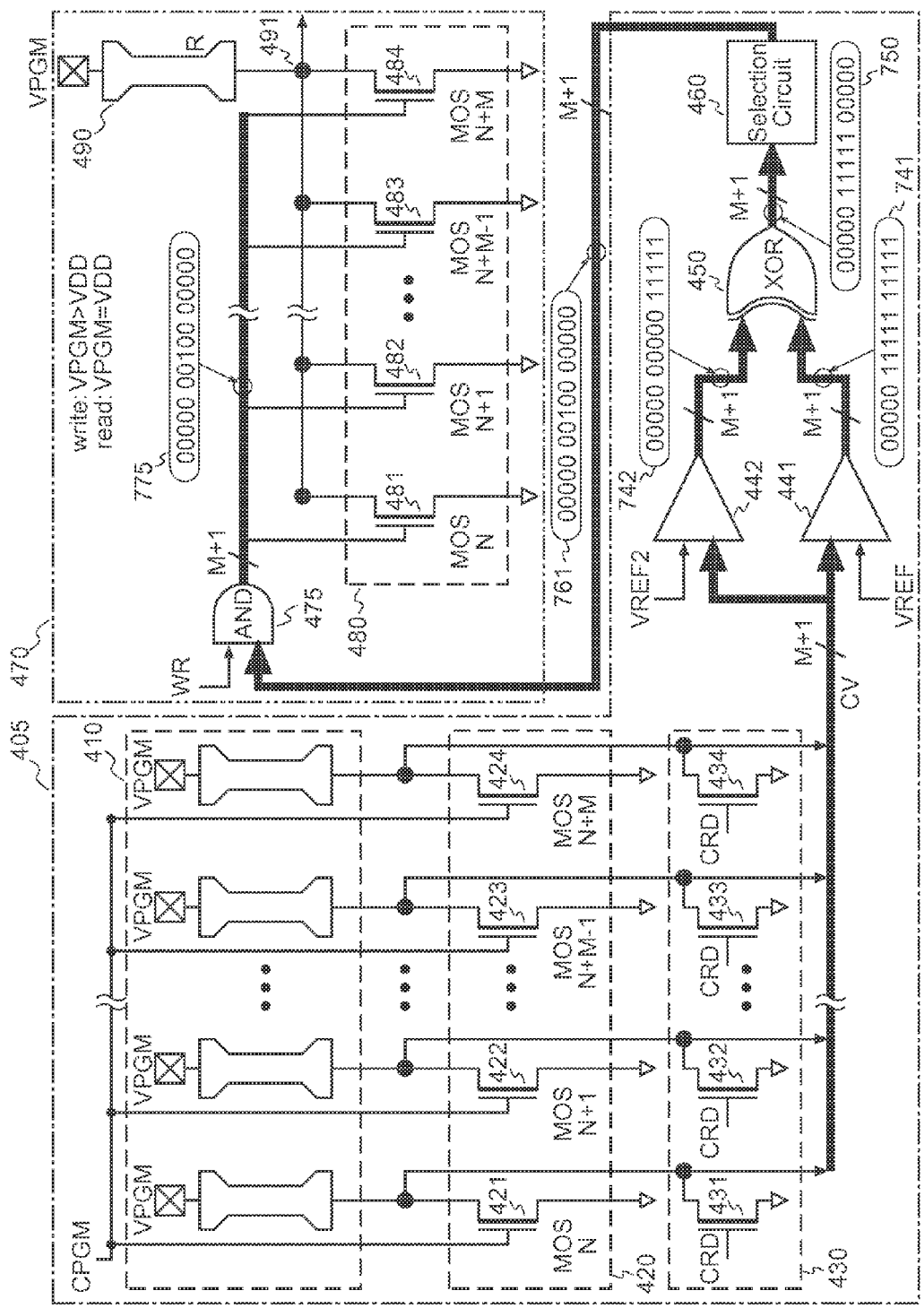
FIG. 4 is a functional block diagram illustrating a circuit configured to identify and apply a fuse programming current in accordance with one embodiment.
Figure 5:
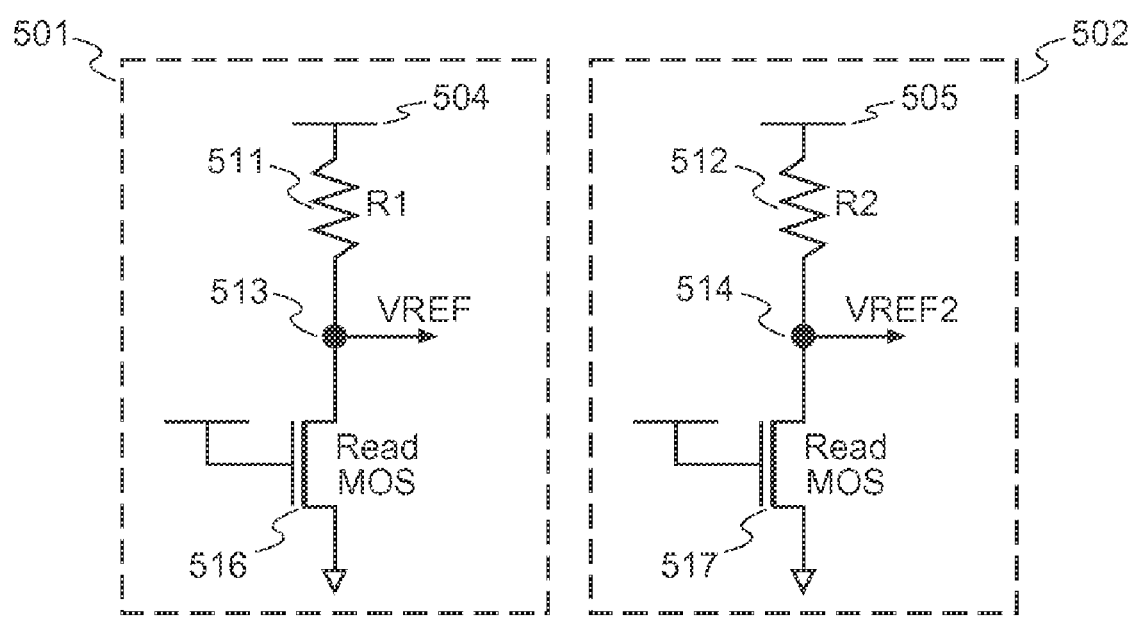
FIG. 5 is a functional block diagram illustrating a circuit configured to generate reference voltages in accordance with one embodiment.

FIG. 5 and FIG. 4 illustrate exemplary circuitry configured to implement a method according to the flowchart of FIG. 3. Illustrated in FIG. 5 is reference voltage generation circuitry. Illustrated in FIG. 4 is a fuse calibration and programming circuit. [REVERSE FIGS. 4 & 5?]

In the embodiment of FIG. 4, the components of fuse calibration circuitry 405 include calibration fuses 410, calibration transistors 420, read transistors 430, comparators 441 and 442, XOR gate 450 and selection circuit 460. In this embodiment, calibration fuses 410 comprise eFuses 411-414. These eFuses may be in one of three states (uncut, cut and destroyed) as described above. Calibration transistors 420 and read transistors 430 comprise NMOS transistors 421-424 and 431-434. Comparators 441 and 442 comprise multiple-bit comparators that are configured to compare voltages associated with each fuse to a reference voltage, and to output a signal indicating whether the fuse voltage is above or below the reference voltage.

As noted above, calibration circuitry 405 includes a set of calibration fuses 410 and a set of calibration transistors 420. Each one of the calibration fuses (e.g. 411) is coupled in series with a corresponding one of the calibration transistors (e.g., 421) between a power supply and ground. A signal line carrying a calibration programming signal (CPGM) is connected to the gates of each of the calibration transistors. When the calibration programming signal is asserted, the calibration transistors are switched on, and current is allowed to flow from the power supply, through the fuse and the transistor, to ground.

Each of calibration transistors 421-424 is configured to allow a different amount of current to flow through it, with transistor 421 allowing a base level (N) of current, and each successive transistor allowing incrementally more current. Thus, transistor 422 is configured to allow current proportional to N+1, transistor 423 allows N+M−1 and, finally, transistor 424 allows N+M. As a result, slightly more current is passed through each successive one of the calibration fuses (411-414.) Assuming that N is insufficient current to cut fuse 411, and that N+M is sufficient current to destroy fuse 414, one or more of the calibration fuses between fuses 411 and 414 should be properly cut (i.e., they should not remain in the uncut state, and they should not be destroyed.) These fuses had amounts of current suitable passed through them for proper programming. If there are several of these fuses, a mid-range current, such as the median or average current among these fuses, would presumably be the best choice for programming additional fuses. The selection of one of these currents for programming additional fuses will be described in more detail below.

In addition to the calibration transistors 420, calibration circuitry 405 includes a set of read transistors 430. Each of the read transistors 430 is connected in series with a corresponding one of the calibration fuses 410 between the power supply and ground. Each of read transistors 430 is controlled by a calibration read signal (CRD) which is applied to its gate. (It should be noted that, in this embodiment, each of the calibration transistors 420 is connected in parallel with a corresponding one of read transistors 430, but calibration programming signal CPGM and calibration read signal CRD are not asserted at the same time.) In contrast to the calibration transistors, each of read transistors 431-434 is identical. Thus, when the read transistors are switched on, the voltage at the node between each fuse-transistor pair varies only with the resistance of the fuse. If a fuse is uncut, the corresponding voltage will be higher than if the fuse is cut (because the cut fuse will have a higher resistance than the uncut fuse, resulting in a greater voltage drop across the cut fuse.) If a fuse is cut, the corresponding voltage will be higher than if the fuse is destroyed, but lower than if the fuse is uncut. If the fuse is destroyed, the corresponding voltage will be lower than if the fuse is uncut or cut (but not destroyed.)

In order to determine the state of each of the calibration fuses after they have been programmed (i.e., after the different calibration currents have been passed through the fuses,) the voltage associated with each of the calibration fuses is compared to two reference voltages. One of the reference voltages is between the voltages associated with uncut and cut (but not destroyed) fuses. The other reference voltage is between the voltages associated with cut (but not destroyed) and destroyed fuses.

The node between each fuse-transistor pair is connected to an input of each of comparators 441 and 442. Comparator 441 also receives a first reference signal (VREF) corresponding to the first reference voltage noted above. Comparator 441 compares the voltage corresponding to each fuse to this reference voltage to determine whether the fuse is uncut or cut. If the fuse is uncut, the voltage will be higher than first reference voltage, and comparator 441 will generate a 0. If the fuse is cut, the voltage corresponding to the fuse will be lower than the first reference voltage, and comparator 441 will generate a 1. Comparator 442 is similarly configured, except that it is configured to compare the fuse voltages to the second reference voltage signal (VREF2). If the fuse is not destroyed, the voltage corresponding to the fuse will be higher than the second reference voltage, and comparator 442 will generate a 0, indicating that the fuse is not destroyed. If, the other hand, the fuse is destroyed, the voltage corresponding to the fuse will be lower than the second reference voltage. Comparator 442 will therefore generate a 1, indicating that the fuse has been destroyed.

FIG. 5 illustrates two voltage reference generators in accordance with one embodiment. These reference voltages produced by these generators (one of a higher voltage and the other of a lower voltage) are input to comparators 441 and 442. Each reference voltage generator (501, 502) includes a resistor (511, 512) and a read transistor (516, 517). The resistor and transistor of each voltage generator are coupled in series between a supply voltage and ground. The resistors are of intermediate resistances relative to the resistances of the fuse states. The read transistors are of the same type as read transistors 430 of calibration circuitry 405.

Voltage generator 501 generates the higher of the two reference voltages (VREF.) Voltage generator 501 includes resistor 511, which has a resistance (e.g., 5R) between the resistance of an uncut fuse (e.g., R) and the resistance of a cut fuse (e.g., 10R). Resistor 511 is coupled to transistor 516 at node 513. Reference voltage VREF is taken at node 513. Voltage generator 502 generates the lower of the two reference voltages (VREF2.) Voltage generator 502 includes resistor 512, which has a resistance (e.g., 500R) between the resistance of a cut fuse (e.g., 10R) and the resistance of a destroyed fuse (e.g., 1000R). Resistor 512 is coupled to transistor 517 at node 514. Reference voltage VREF2 is taken at node 514. The supply voltage is the same for each of the reference voltage generators, and is applied to the gates of transistors 516 and 517 so that they remain switched on. The reference voltages VREF and VREF2 are coupled to the comparison circuitry (441, 442) of the calibration circuitry (405) of FIG. 4.

Referring again to FIG. 4, as noted above, comparators 441 and 442 are, as noted above, multiple-bit comparators. That is, each comparator is configured to compare multiple fuse voltages to a corresponding reference voltage. Because there are M+1 calibration fuses in the embodiment of FIG. 4, each of these comparators receives M+2 inputs (M+1 fuse voltages and the reference voltage.) Similarly, the comparison of each of the M+1 fuse voltages to the reference voltage results in M+1 output bits. The input lines to comparators 441 and 442, as well as the output lines from the comparators, are therefore shown in the figure as being M+1 bits wide.

The outputs of comparators 441 and 442 are provided as inputs to XOR gate 450. As noted above, the input received from comparators 441 and 442 are each M+1 bits wide. XOR gate 450 performs a bit-wise XOR operation on these inputs to produce an output that is also M+1 bits wide. Thus, the first bit received from comparator 441 is XOR'ed with the first bit received from comparator 442 to produce the first bit of the output of XOR gate 450, and so on. XOR gate 450 thereby generates a signal indicating whether or not each of the calibration fuses has been properly cut (i.e., cut but not destroyed.) In this embodiment, a 1 indicates that the corresponding fuses has been properly cut, while a 0 indicates that the corresponding fuse either has not been cut, or has been destroyed.

In FIG. 4, the outputs of comparators 441 and 442, as well as the output of XOR gate 450 are represented by an exemplary series of bits (0's and 1's) that are indicated by reference numbers 741, 742 and 750. Each representation includes a series of 15 bits. The output of comparator 441 is "00000 11111 11111". The output of comparator 442 is "00000 00000 11111". The output of XOR gate 450 is "00000 11111 00000". These bit representations more clearly show the bit-wise XOR'ing of the outputs of the two comparators, and the indication of which fuses were properly cut.

The output of XOR gate 450 is provided to selection circuit 460. The purpose of selection circuit 460 in this embodiment is to generate, based upon the output of XOR gate 450, control signals that will be provided to programming circuitry 470. These control signals will determine the amount of current that is used by programming circuitry 470 to program (cut) additional fuses. This current should the same as the current which was used to program one of the properly cut calibration fuses, as indicated by the 1's in the output of XOR gate 450. While the currents corresponding to any one of these properly cut calibration fuses should also properly cut additional fuses, it is contemplated that the best current to be used by programming circuitry 470 is the current which is the median or average of the currents represented by the 1's in the output of XOR gate 450. Since, in this embodiment, the currents used to program successive calibration fuses increased by the same increment, the average/median current would be the same as the current corresponding to the middle calibration fuse (the eighth of the 15 bits in representation 750.)

The output of selection circuit 460 may take a variety of forms. The specific form may be driven by the configuration of programming circuitry 470. In this embodiment, selection circuit 460 generates an output signal that has the same number of bits as the signal received from XOR gate 450. The output of selection circuit 460 has M bits that are 0's, and a single bit that is a 1. The bits of the output signal are indicated by reference number 761. The 1 corresponds to the selected programming current, and will be used by programming circuitry 470 to turn on a corresponding one of a set of transistors 480 that allows this amount of current to pass through a fuse that is being programmed. The 0's in the output of selection circuit 460 turn off the remainder of the transistors in the programming circuitry.

The output signal generated by selection circuit 460 is provided to programming circuitry 470 and is input to AND gate 475. AND gate 475 also receives write signal WR as an input. Similar to XOR gate 450, AND gate 475 is a multiple-bit logic gate. AND gate 475 is configured to logically AND each bit of the signal received from selection circuit 460 with the write signal to generate an output signal which drives transistors 481-484. Each bit will switch off the corresponding transistor if it is a 0, and switch on the transistor if it is a 1. Thus, when the write signal is not asserted, all of transistors 481-484 are switched off, and when the write signal is asserted, a single one of transistors 481-484 is switched on while the remainder of the transistors are switched off (see bits 775.) Each of transistors 480 has a conductance which is the same as a corresponding one of transistors 420 (i.e., both transistors 421 and 481 allow current proportional to N, 422 and 482 allow current proportional to N+1, and so on.) The transistor which is switched on allows a corresponding amount of current to flow from a voltage source through fuse 490 and the transistor to ground. Since this current was found to have properly cut one of the calibration transistors, fuse 490 will be cut without destroying it. The system can be used in the selective programming of multiple target fuses.

Figure 6:
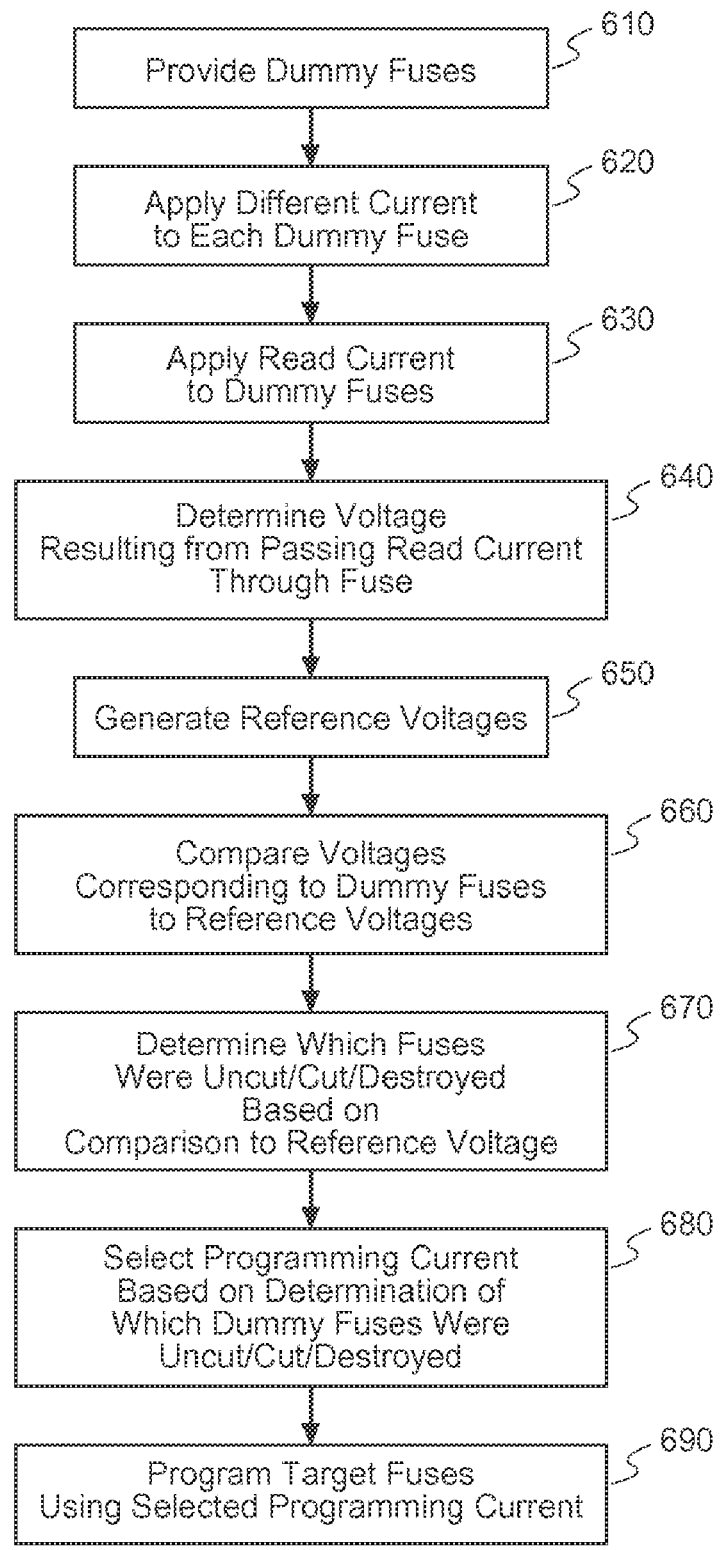
FIG. 6 is a flowchart of a method to determine a programming current in accordance with the embodiment of FIG. 4.

The operation of the system of FIG. 4 can be summarized as shown in the flowchart of FIG. 6. A first portion of the flowchart of FIG. 6 corresponds to the calibration step (310) of FIG. 3, while a second portion corresponds to the read step (320) of FIG. 3, and a third portion corresponds to the programming step (330.) The method of FIG. 6 begins with providing a set of dummy calibration fuses (block 610) and application of a set of different currents to each of the calibration fuses (block 620.) As a result, one or more of the fuses will be uncut, one or more will be cut, and one or more will be destroyed. A low read current will then be applied to each of these fuses (block 630) and voltages generated as a result of the voltage drop across the fuses will then be determined (block 640.) Reference voltages will also be generated (block 650.) The fuses voltages will be compared to the reference voltages (block 660) and it will thereby be determined which of the fuses were uncut, which were cut and which were destroyed (block 670.) Then, based on the determination of which fuses were uncut, cut and destroyed, a programming current will be selected (block 680.) The selected programming current will then be applied to additional fuses to program them (block 690.)

Figure 7:
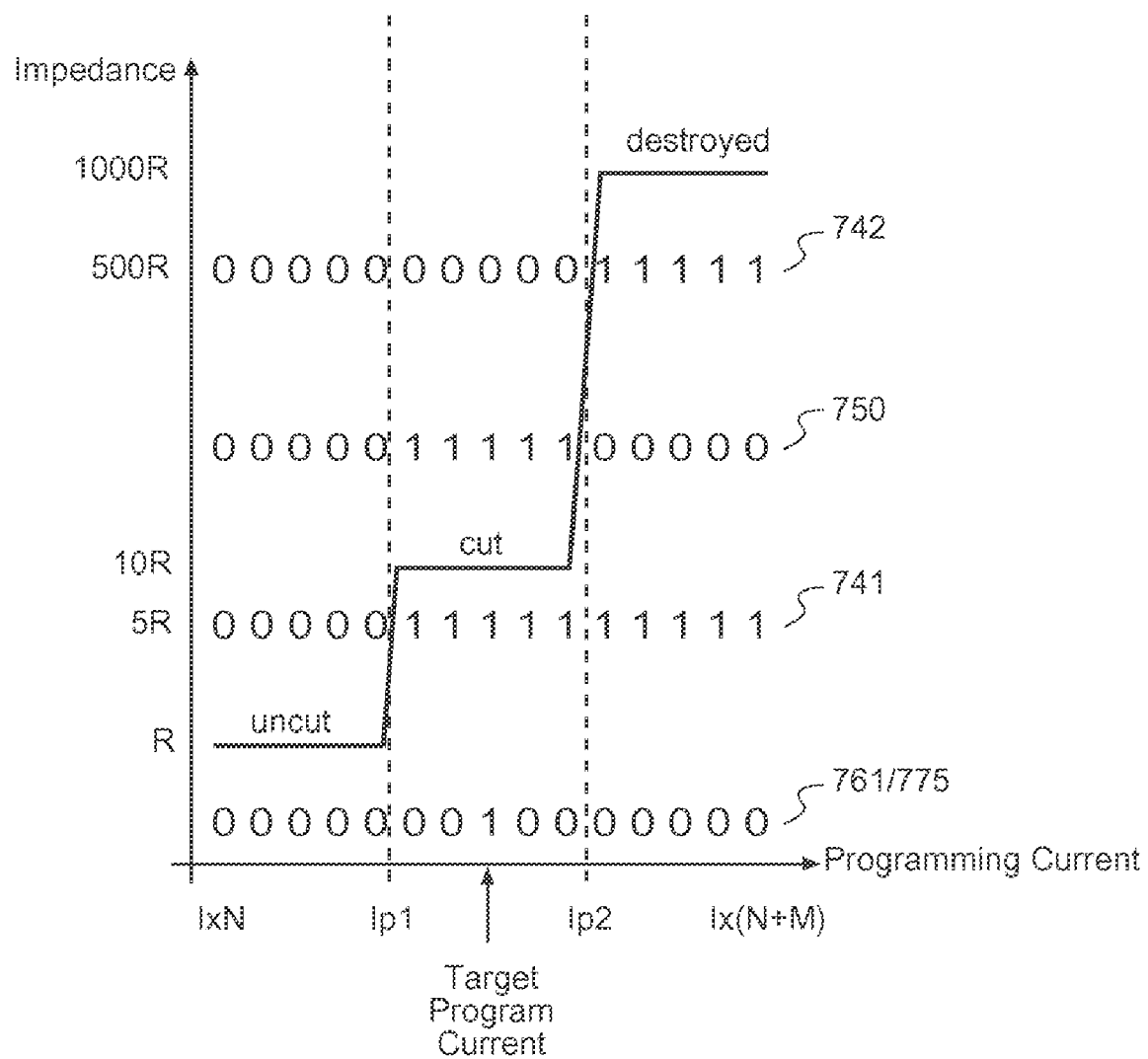
FIG. 7 is a plot illustrating an example of fuse impedances and signal bit strings in accordance with one embodiment.

Referring to FIG. 7, a plot of fuse impedance versus programming current is shown. The plot of FIG. 7 is the same as FIG. 2, except that the plot is annotated with bit strings shown in FIG. 4 to illustrate the relationship of the bit strings to the programming current. The output of comparator 441 (bits 741) indicates that the first five programming currents resulted in a fuse impedance of less than 5R and were therefore insufficient to cut the corresponding fuses. The output of comparator 442 (bits 742) indicates that the last five programming currents resulted in a fuse impedance of more than 500R and therefore must have destroyed the corresponding fuses. The output of XOR gate 450 (bits 750) indicates that the middle five programming currents resulted in a fuse impedance of between 5R and 500R, and therefore properly cut the corresponding fuses. The output of selection circuit 460 (bits 761) indicates that the middle programming current is selected for use in programming additional fuses.

Figure 8:
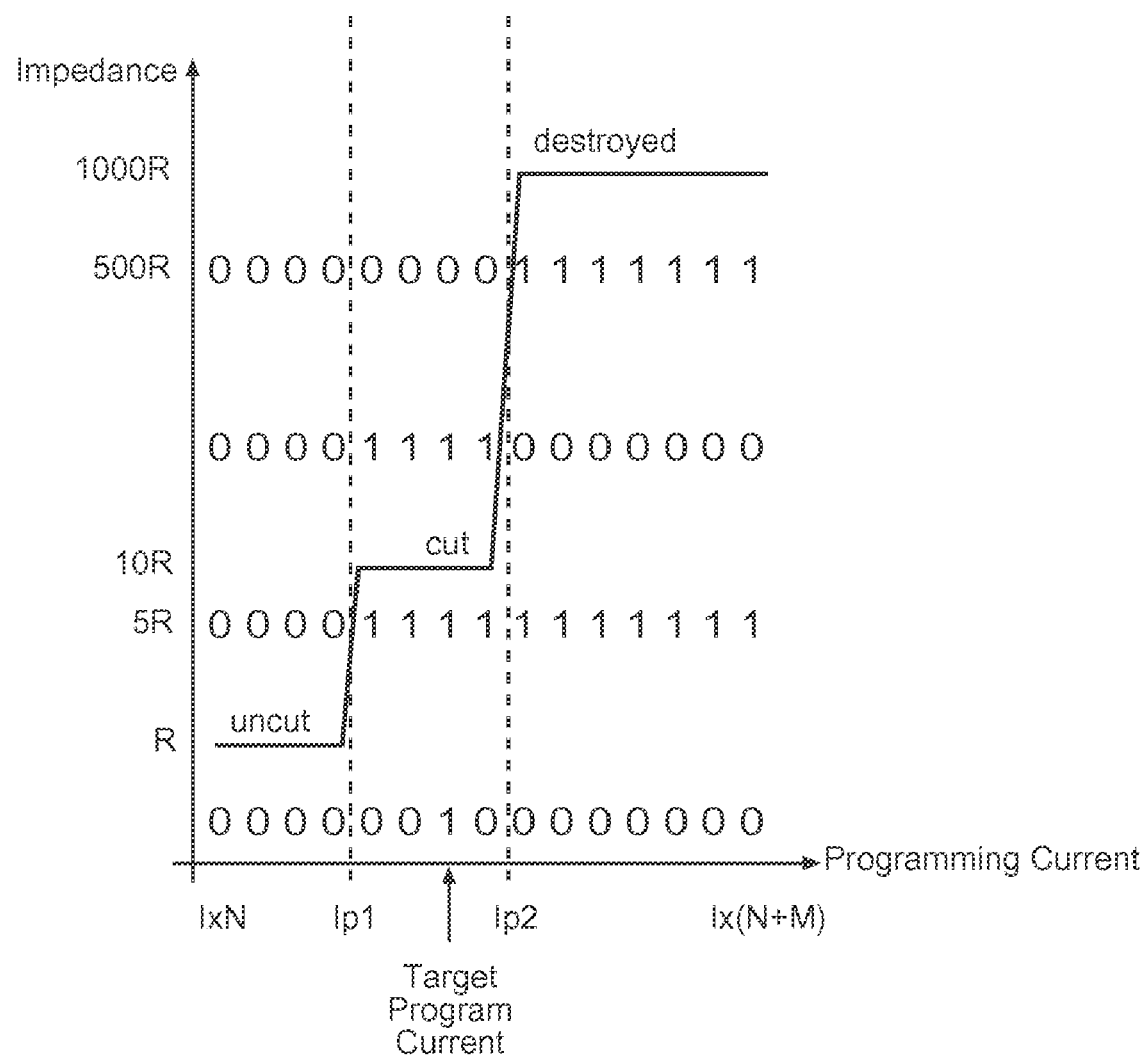
FIG. 8 is a plot illustrating an alternative example of fuse impedances and signal bit strings in accordance with one embodiment.

Referring to FIG. 8, a plot of fuse impedance versus programming current is shown for an embodiment in which manufacturing differences or other factors have affected the fuse programming currents. In this embodiment, the programming of the calibration fuses resulted in four of the fuses being uncut, and seven of the fuses being destroyed. The fifth through eighth of the fuses were therefore properly cut, and the seventh programming current was selected for programming additional fuses.

Figure 9:
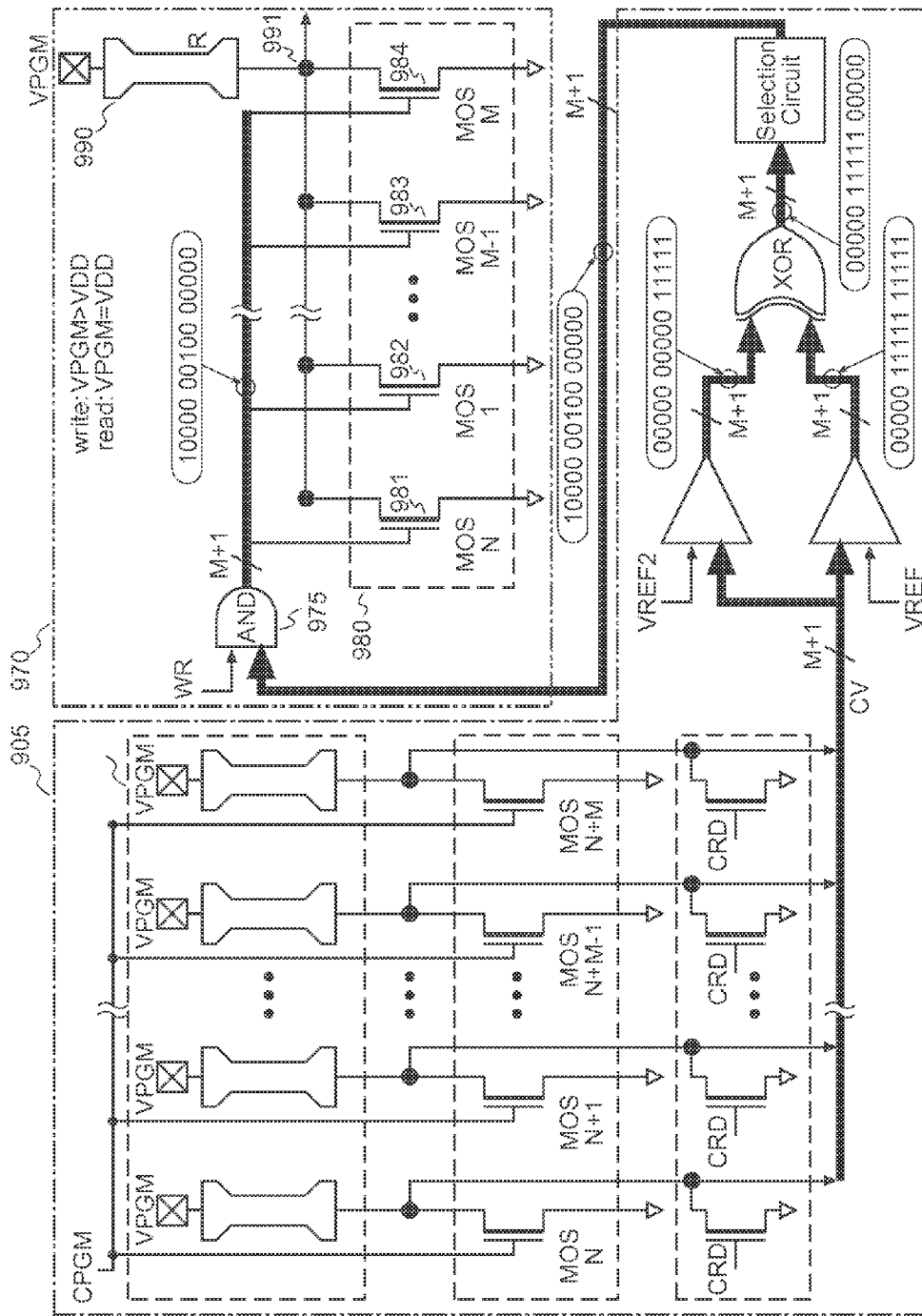
FIG. 9 is a functional block diagram illustrating a circuit configured to identify and apply a fuse programming current in accordance with one embodiment.

Referring to FIG. 9, an alternative embodiment of the present system is shown. In this embodiment, the structure of calibration circuitry 905 is essentially the same as calibration circuitry 405 in FIG. 4, but the structure of programming circuitry 970 is slightly different from the corresponding circuitry of FIG. 4. Programming circuitry 970 includes a set of transistors 980 which are selectively switched on and off to allow a suitable programming current to pass through fuse 990. Rather than switching on only a single one of these transistors, however, a set of transistors may be switched on so that the desired current is generated cumulatively. In other words, when fuse 990 is programmed, transistor 981 is switched on to provide a base amount of current (I×N) and an additional transistor (e.g., 982) is switched on to provide a current offset (some multiple of I). Thus, the combined currents through these transistors (which will cumulatively flow through fuse 990) will equal the desired programming current, resulting in a properly cut fuse.

Figure 10A:
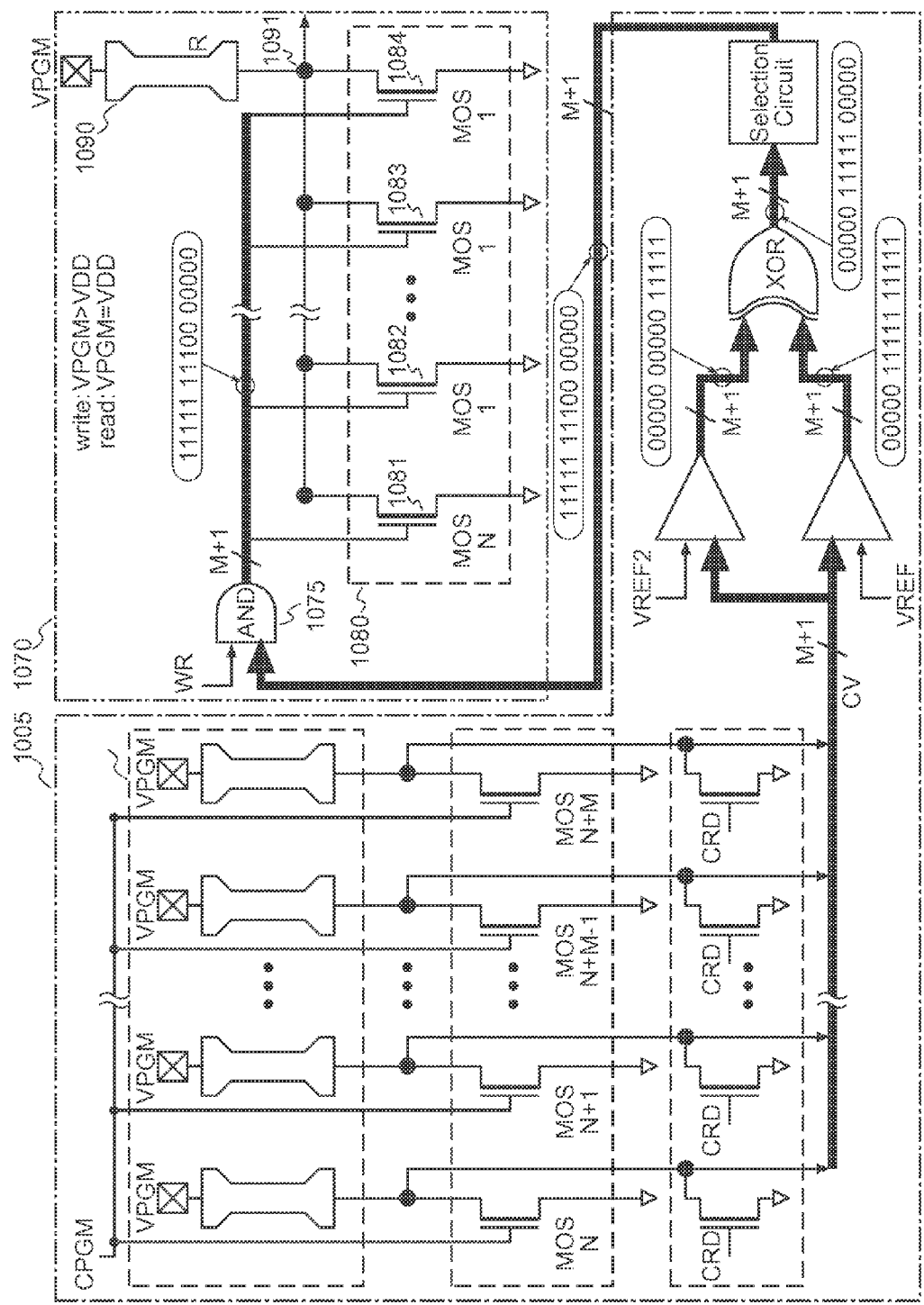
FIG. 10A is a functional block diagram illustrating a circuit configured to identify and apply a fuse programming current in accordance with one embodiment.

Referring to FIG. 10A, another alternative embodiment of the present system is shown. In this embodiment, the structure of calibration circuitry 1005 is essentially the same as calibration circuitry 905 in FIG. 9, but the structure of programming circuitry 1070 is slightly different from the corresponding circuitry of FIG. 9. Programming circuitry 1070 includes a set of transistors 1080 which are selectively switched on and off to allow a suitable programming current to pass through fuse 1090. Rather than switching on a single transistor as in the embodiment of FIG. 4, or a pair of transistors as in the embodiment of FIG. 9, a larger set of transistors may be switched on so that the desired current is generated cumulatively. In other words, when fuse 1090 is programmed, transistor 1081 is switched on to provide a base amount of current (I×N) and an additional number of transistors (e.g., 1082 and 1083) is switched on to provide a current offset (some multiple of I). For example, when the calibration and selection circuitry indicates that a current I×(N+7) is needed, then the base current of I×N is provided by switching on programming transistor 1081 and the additional current of I×7 is provided by switching on seven additional programming transistors. Thus, the combined currents through these transistors (which will cumulatively flow through fuse 1090) will equal the desired programming current, resulting in a properly cut fuse.

Figure 10B:
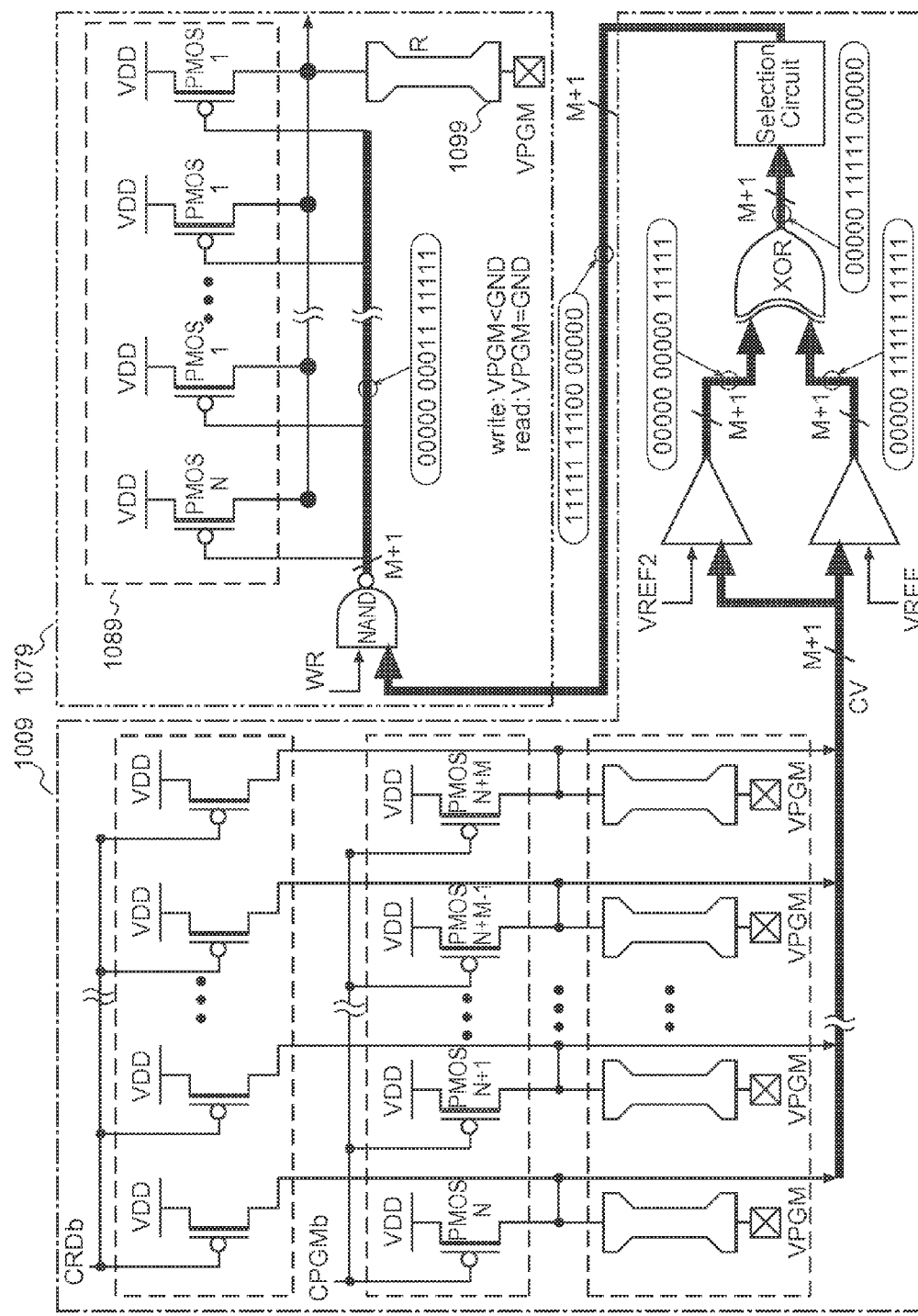
FIG. 10B is a functional block diagram illustrating a circuit configured to identify and apply a fuse programming current in accordance with one embodiment.

Referring to FIG. 10B, yet another alternative embodiment of the present system is shown. In this embodiment, the function of calibration circuitry 1009 and programming circuitry 1079 are essentially the same as circuitry 1005 and 1070 in FIG. 10A, but the structure is slightly different from the corresponding circuitry of FIG. 10A. Each one of the calibration fuses is coupled in series with a corresponding one of the calibration transistors between a power supply and ground. However, each transistor is coupled to a power supply and the fuses are coupled to ground. Similarly, the programming transistors and the fuse to be programmed (1099) are coupled to a power supply and ground, respectively. When the calibration (programming) signal is asserted, the calibration (programming) transistors are switched on, and current is allowed to flow from the power supply, through the transistor and the fuse, to ground.

Figure 11:
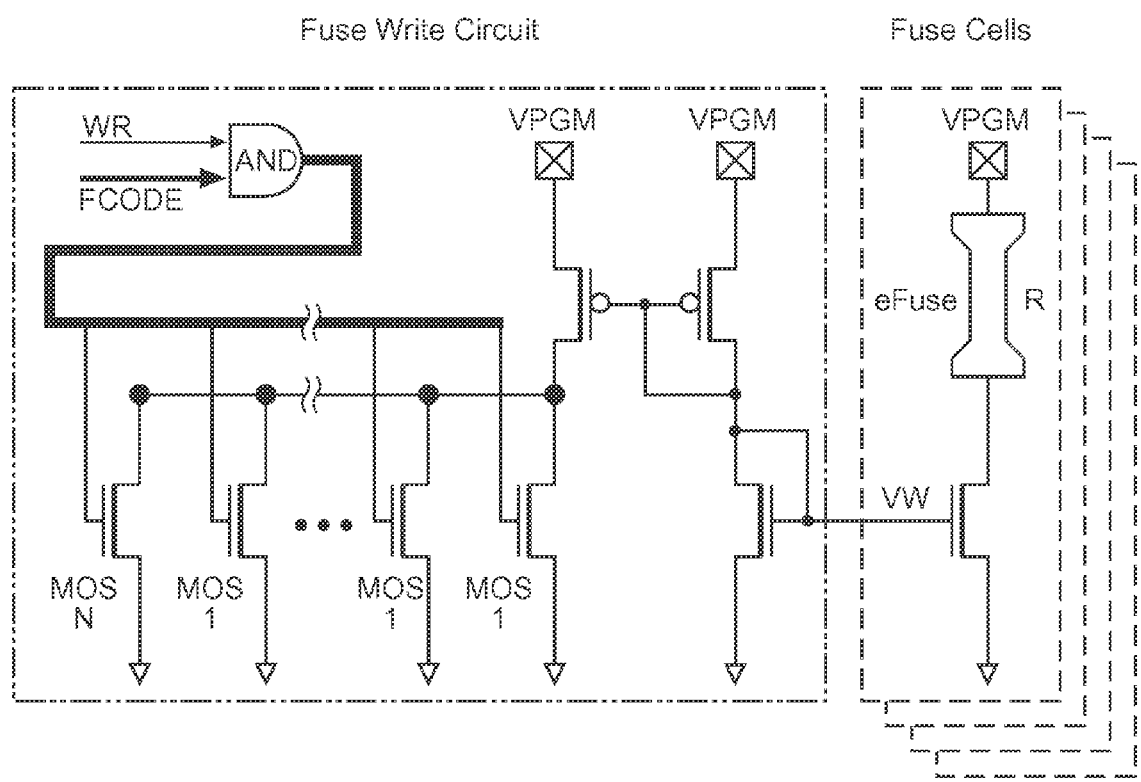
FIG. 11 is a functional block diagram illustrating a circuit configured to apply a fuse programming current to multiple fuse cells in accordance with one embodiment.

It should be noted that there may be many (e.g., 1000 or more) fuse cells on a single chip, so it may be important to minimize the amount of space required for the fuses and associated circuitry. Some embodiments may therefore implement a single calibration circuit and a single programming circuit which can be used to program multiple fuses. This is illustrated in the example of FIG. 11. The embodiment of FIG. 11 utilizes a current mirror structure to generate the desired current for programming each of the fuses.

While the foregoing description presents several specific exemplary embodiments, there may be many variations of the described features and components in alternative embodiments. For example, multiple transistors may be used to provide calibration currents in a manner similar to the programming transistors of FIG. 9. Alternatively, the calibration and programming currents may be provided using components other than transistors. In other embodiments, types of multi-state fuses other than metal-silicide fuses can be used. These could include fuses with more than the three states described above, and the selected programming currents could include currents necessary to achieve selected ones of these states. The voltages or voltage drops associated with the fuses could also be determined in other ways, such as by providing the fuse and reference voltages to differential amplifiers. The signals could also be encoded or multiplexed and conveyed in various ways. Many other variations will also be apparent to persons of skill in the art of the invention upon reading the present disclosure.

Those of skill in the art will understand that information and signals may be represented using any of a variety of different technologies and techniques. For example, data, commands, information, signals, bits, and the like that may be referenced throughout the above description may be represented by voltages, currents, electromagnetic waves, etc. The information and signals may be communicated between components of the disclosed systems using any suitable transport media, including wires, metallic traces, vias, and the like.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A method comprising:
    passing multiple, different currents through a plurality of calibration fuses;
    identifying one or more of the currents that cut corresponding ones of the calibration fuses without destroying the calibration fuses;
    automatically selecting one of the identified currents; and
    programming one or more target fuses with the selected current.

2. The method of claim 1, wherein the currents have incrementally increasing values from a lowest current to a highest current.

3. The method of claim 1, wherein identifying the currents that cut but did not destroy the corresponding calibration fuses comprises determining which of the calibration fuses have a desired impedance and identifying the currents corresponding to the calibration fuses having the desired impedance.

4. The method of claim 3, wherein determining which of the calibration fuses have the desired impedance comprises determining which of the calibration fuses have impedances below an impedance of a destroyed fuse and above an impedance of an uncut fuse.

5. The method of claim 4, wherein determining an impedance of a corresponding one of the calibration fuses comprises:
    generating a first reference voltage drop across a first reference component having a first reference impedance,
        wherein the first reference impedance is greater than the uncut fuse impedance and less than the cut fuse impedance;
    generating a second reference voltage drop across a second reference component having a second reference impedance,
        wherein the second reference impedance is greater than the cut fuse impedance and less than the destroyed fuse impedance;
    determining a fuse voltage drop across the calibration fuse; and
    determining that the calibration fuse impedance
        is the uncut fuse impedance when the fuse voltage drop is less than the first reference voltage drop,
        is the cut fuse impedance when the fuse voltage drop is greater than the first reference voltage drop and less than the second reference voltage drop, and
        is the destroyed fuse impedance when the fuse voltage drop is greater than the second reference voltage drop.

6. The method of claim 1, wherein automatically selecting one of the identified currents comprises selecting one of the identified currents which has a mid-range value among the identified currents.

7. The method of claim 1, wherein programming the target fuses with the selected current comprises generating control signals which switch on transistors configured to generate the selected current and passing the selected current through the target fuses.

8. The method of claim 1, wherein each of the calibration and target fuses is substantially identical, and wherein each of the fuses has an impedance which is a first value when uncut, a second value when cut but not destroyed, and a third value when destroyed.

9. The method of claim 8, wherein each of the calibration and target fuses comprises a metal-silicide layer and is programmable by passing a current therethrough to agglomerate the metal-silicide.

10. The method of claim 1, wherein passing the multiple, different currents through the calibration fuses comprises placing each calibration fuse in series with a corresponding calibration transistor between a supply voltage and ground, wherein each calibration transistor is configured to allow a corresponding one of the currents to pass therethrough when the calibration transistor is switched on.

11. A system comprising:
    calibration circuitry configured to
        pass multiple, different currents through a plurality of calibration fuses,
        identify one or more of the currents that cut corresponding ones of the calibration fuses without destroying the calibration fuses, and
        automatically select one of the identified currents; and
    programming circuitry configured to program one or more target fuses with the selected current.

12. The system of claim 11, wherein the multiple, different currents generated by the calibration circuitry have incrementally increasing values from a lowest current to a highest current.

13. The system of claim 11, wherein the calibration circuitry is configured to determine which of the calibration fuses have a desired impedance and to identify the currents corresponding to the calibration fuses having the desired impedance.

14. The system of claim 13, wherein the calibration circuitry is configured to determine which of the calibration fuses have impedances below an impedance of a destroyed fuse and above an impedance of an uncut fuse.

15. The system of claim 14, further comprising one or more reference voltage generators configured to:
    generate a first reference voltage drop across a first reference component having a first reference impedance,
        wherein the first reference impedance is greater than the uncut fuse impedance and less than the cut fuse impedance;
    generate a second reference voltage drop across a second reference component having a second reference impedance,
        wherein the second reference impedance is greater than the cut fuse impedance and less than the destroyed fuse impedance;
    determine a fuse voltage drop across the calibration fuse; and
    determine that the calibration fuse impedance
        is the uncut fuse impedance when the fuse voltage drop is less than the first reference voltage drop,
        is the cut fuse impedance when the fuse voltage drop is greater than the first reference voltage drop and less than the second reference voltage drop, and is the destroyed fuse impedance when the fuse voltage drop is greater than the second reference voltage drop.

16. The system of claim 11, wherein the calibration circuitry is configured to select one of the identified currents which has a mid-range value among the identified currents.

17. The system of claim 11, wherein the calibration circuitry is configured to generating control signals which cause the programming circuitry to generate the selected current.

18. The system of claim 11, wherein each of the calibration and target fuses is substantially identical, and wherein each of the fuses has an impedance which is a first value when uncut, a second value when cut but not destroyed, and a third value when destroyed.

19. The system of claim 18, wherein each of the calibration and target fuses comprises a metal-silicide layer and is programmable by passing a current therethrough to agglomerate the metal-silicide.

20. The system of claim 11, wherein within the programming circuitry, each calibration fuse is positioned in series with a corresponding calibration transistor between a supply voltage and ground, wherein each calibration transistor is configured to allow a corresponding one of the currents to pass therethrough when the calibration transistor is switched on.

* * * * *